(12) United States Patent
Yuasa et al.

(10) Patent No.: US 10,796,925 B2
(45) Date of Patent: Oct. 6, 2020

(54) CERAMIC CIRCUIT SUBSTRATE AND METHOD FOR MANUFACTURING SAME

(71) Applicant: Denka Company Limited, Chuo-ku, Tokyo (JP)

(72) Inventors: Akimasa Yuasa, Omuta (JP); Kouji Nishimura, Omuta (JP)

(73) Assignee: Denka Company Limited, Tokyo (JP)

( * ) Notice: Subject to any disclaimer, the term of this patent is extended or adjusted under 35 U.S.C. 154(b) by 0 days.

(21) Appl. No.: 16/097,131

(22) PCT Filed: Apr. 25, 2017

(86) PCT No.: PCT/JP2017/016425
§ 371 (c)(1),
(2) Date: Oct. 26, 2018

(87) PCT Pub. No.: WO2017/188273
PCT Pub. Date: Nov. 2, 2017

(65) Prior Publication Data
US 2019/0115228 A1    Apr. 18, 2019

(30) Foreign Application Priority Data
Apr. 28, 2016    (JP) ................................. 2016-090858

(51) Int. Cl.
*H05K 1/03*    (2006.01)
*H05K 1/02*    (2006.01)
(Continued)

(52) U.S. Cl.
CPC ............ *H01L 21/481* (2013.01); *H01L 23/13* (2013.01); *H01L 23/3735* (2013.01);
(Continued)

(58) Field of Classification Search
CPC . H01L 21/481; H01L 23/49838; H01L 23/13; H01L 23/15; H01L 21/4846;
(Continued)

(56) References Cited

U.S. PATENT DOCUMENTS 6,201,696 B1 * 3/2001 Shimizu .................. H01L 23/24
361/704
8,411,455 B2 * 4/2013 Kondo ................. B23K 1/0016
174/257
(Continued)

FOREIGN PATENT DOCUMENTS

EP    921565 A2    6/1999
JP    H07-106740 A    4/1995
(Continued)

*Primary Examiner* — Ishwarbhai B Patel
(74) *Attorney, Agent, or Firm* — Foley & Lardner LLP (57) ABSTRACT

Disclosed herein is a ceramic circuit substrate for a power module obtained by applying an insulating resin for preventing solder flow and chip displacement and an insulating resin for preventing partial discharges and the lowering of insulation to a main surface of a metal circuit and to the outer periphery of the metal circuit or between metal circuits, respectively. Also disclosed herein are methods for manufacturing a ceramic circuit substrate for a power module.

8 Claims, 3 Drawing Sheets

(51) Int. Cl.
*H01L 23/15* (2006.01)
*H01L 21/48* (2006.01)
*H01L 23/373* (2006.01)
*H01L 23/13* (2006.01)
*H01L 23/00* (2006.01)
*H05K 3/28* (2006.01)
*H01L 23/498* (2006.01)
*H05K 1/18* (2006.01)

(52) U.S. Cl.
CPC ........ *H01L 23/49838* (2013.01); *H01L 24/00* (2013.01); *H05K 1/0306* (2013.01); *H05K 3/28* (2013.01); *H01L 21/4846* (2013.01); *H01L 23/15* (2013.01); *H05K 1/0203* (2013.01); *H05K 1/18* (2013.01)

(58) Field of Classification Search
CPC ...... H05K 3/28; H05K 1/0201; H05K 1/0203; H05K 1/0206; H05K 1/0207; H05K 1/0284; H05K 1/0306; H05K 1/05; H05K 1/056; H05K 1/09; H05K 1/18; H05K 1/181
See application file for complete search history.

(56) References Cited

U.S. PATENT DOCUMENTS

| | | | |
|---|---|---|---|
| 8,520,389 B2* | 8/2013 | Rozman | H01L 23/24 361/709 |
| 2006/0205112 A1 | 9/2006 | Standing et al. | |
| 2007/0246833 A1 | 10/2007 | Soga et al. | |
| 2013/0154110 A1 | 6/2013 | Gowda | |
| 2013/0240909 A1 | 9/2013 | Hiramatsu et al. | |
| 2015/0255370 A1 | 9/2015 | Shiota et al. | |
| 2015/0262962 A1* | 9/2015 | Matsumoto | H01L 23/60 257/784 |
| 2015/0282323 A1* | 10/2015 | Shimizu | H01L 25/105 361/767 |
| 2015/0373829 A1* | 12/2015 | Ishikawa | H05K 1/028 174/254 |

FOREIGN PATENT DOCUMENTS

| | | |
|---|---|---|
| JP | H07-263845 A | 10/1995 |
| JP | H10-70212 A | 3/1998 |
| JP | 2001-185664 A | 7/2001 |
| JP | 2002-076190 | 3/2002 |
| WO | WO-2014-080476 A1 | 5/2014 |

* cited by examiner

CERAMIC CIRCUIT SUBSTRATE AND METHOD FOR MANUFACTURING SAME

CROSS-REFERENCE TO RELATED APPLICATIONS

This application is a National Phase of International Patent Application No. PCT/JP2017/016425, filed Apr. 25, 2017, which claims priority to Japanese Patent Application No. 2016-090858, filed Apr. 28, 2016. The contents of these applications are herein incorporated by reference in their entirety.

TECHNICAL FIELD

The present invention pertains to a ceramic circuit substrate applied particularly to power semiconductor modules, etc. and a manufacturing method for the same.

BACKGROUND ART

From viewpoints such as thermal conductivity, cost, and safety, alumina, beryllia, silicon nitride, aluminum nitride, etc. ceramic substrates are used as circuit substrates employed in power modules and the like. These ceramic substrates are used as circuit substrates by bonding metal circuits of copper, aluminum, etc. and heat dissipating plates thereto. These are advantageous in that they stably obtain high insulation as compared with resin substrates or metal substrates using resin layers as an insulating material.

Conventionally, ceramic circuit substrates in which metal circuits having conductivity are bonded, with a brazing material, to a main surface of a ceramic substrate for semiconductor mounting and semiconductor elements are further mounted at predetermined locations on the metal circuits are used in uses for power modules such as in elevators, vehicles, and hybrid cars. As circuit substrates have miniaturized and power modules have increased in power output in recent years, high electrical insulation has been demanded in ceramic substrate materials in addition to heat dissipation characteristics and aluminum nitride substrates, silicon nitride substrates, etc. which have excellent thermal conductivity and insulating characteristics, have attracted attention.

The abovementioned ceramic circuit substrates are used as semiconductor chips by bonding an Si chip or an SiC chip with solder, but in order to prevent flowing of the solder itself or chip displacement when soldering, an insulating resin is applied to the main surface of the metal circuit as solder resist (Patent Document 1).

Further, in vehicle uses such as electric railways in particular, ceramic circuit substrates are used at high voltage and an insulating resin is applied in order to prevent the degradation of insulation due to migration and partial discharges from circuit ends and bonds (Patent Document 2).

However, solder resist for preventing against solder flow is generally applied to the main surface of metal circuits by screen printing methods, which is performed as part of the resist printing process for ceramic circuit substrates. Further, the insulating resin for preventing partial discharges and migration is generally applied by using a dispenser during the process for mounting semiconductor elements on the circuit substrate. Different processes are required in order to apply these insulating resins and there is the problem of these being connected to lowered productivity, the lowering of partial discharge characteristics due to positional displacement of the insulating resins, and the degradation of insulating properties.

PATENT DOCUMENTS

[Patent Document 1] JP H10-70212 A
[Patent Document 2] JP 2002-76190 A

SUMMARY OF INVENTION

In view of the above problems, the objective of the present invention is to provide a ceramic circuit substrate to which an insulating resin for preventing solder flow or chip displacement and an insulating resin for preventing partial discharges or the lowering of insulation are applied, without lowering productivity or worsening partial discharge characteristics or lowering insulating properties due to positional displacement of the insulating resins, and a manufacturing method for the same.

The present invention, which solves the above problem, is configured as follows.

(1) A ceramic circuit substrate for a power module formed by bonding a metal circuit and a ceramic substrate, characterized in that an insulating resin is applied on a main surface of the metal circuit and to an outer peripheral part of the metal circuit and/or between metal circuits.

(2) The ceramic circuit substrate for a power module as in (1), characterized in that the ceramic substrate is an aluminum nitride, silicon nitride, or alumina substrate, the metal circuit is constituted by at least one metal selected from copper and aluminum, and a resin containing at least one resin selected from an epoxy resin, a polyimide resin, an acrylic resin, and a silicone resin is used as the insulating resin.

(3) A method for manufacturing the ceramic circuit substrate for a power module described in (1) or (2), characterized in that the insulating resin is simultaneously applied to the main surface of the metal circuit and the outer peripheral part of the metal circuit and/or between the metal circuits.

(4) The method for manufacturing the ceramic circuit substrate for a power module of (3), characterized in that the application method for the insulating resin is an inkjet printing method or a pad printing method.

DESCRIPTION OF EMBODIMENTS

Below, various embodiments of the ceramic circuit substrate for a power module shall be explained, followed by an explanation of the method for manufacturing the ceramic circuit substrate, but in cases in which the specific explanation of one embodiment disclosed herein applies to another embodiment, the explanation thereof for the other embodiment shall be omitted.

[Ceramic Circuit Substrate for a Power Module]

Figure 1:
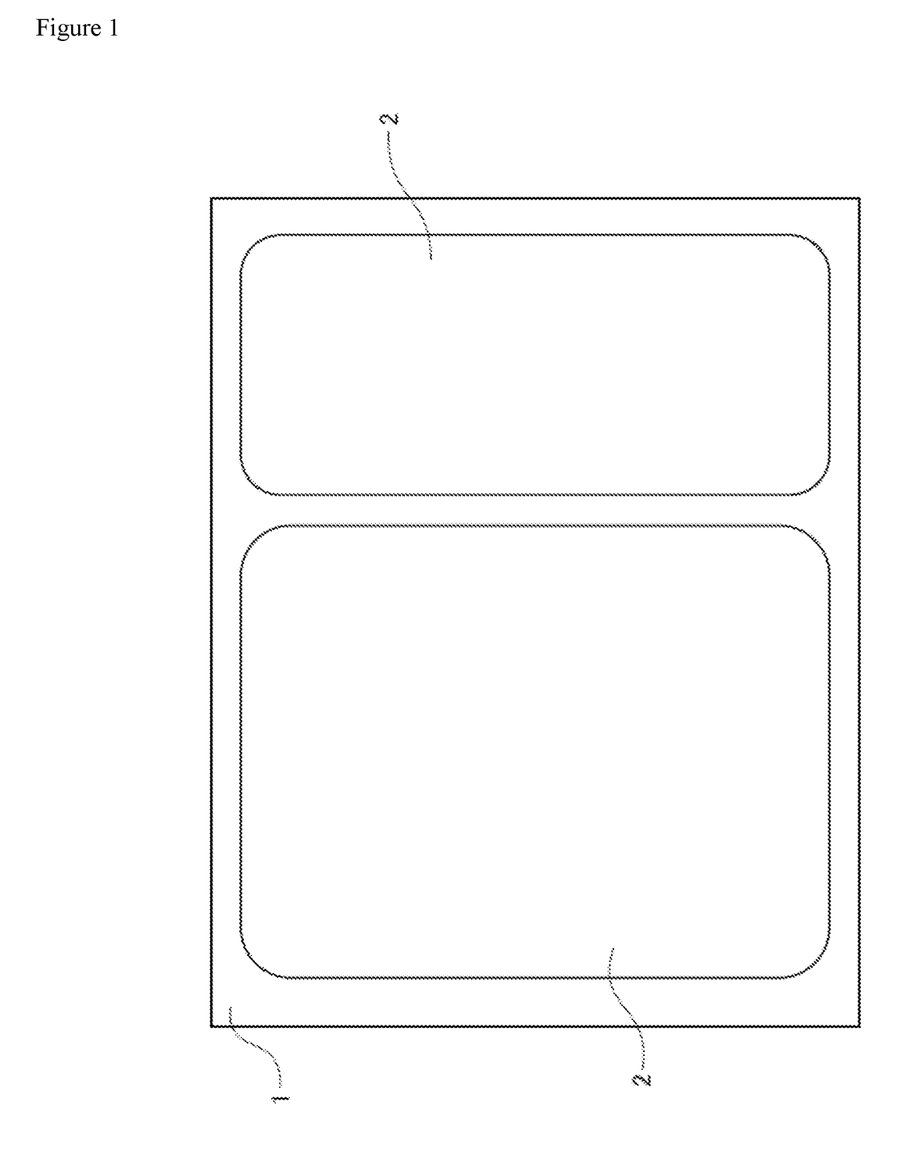
FIG. 1 is an explanatory drawing showing the shape of the metal circuit pattern 2 of the ceramic circuit substrate 1 used in the examples.
Figure 2:
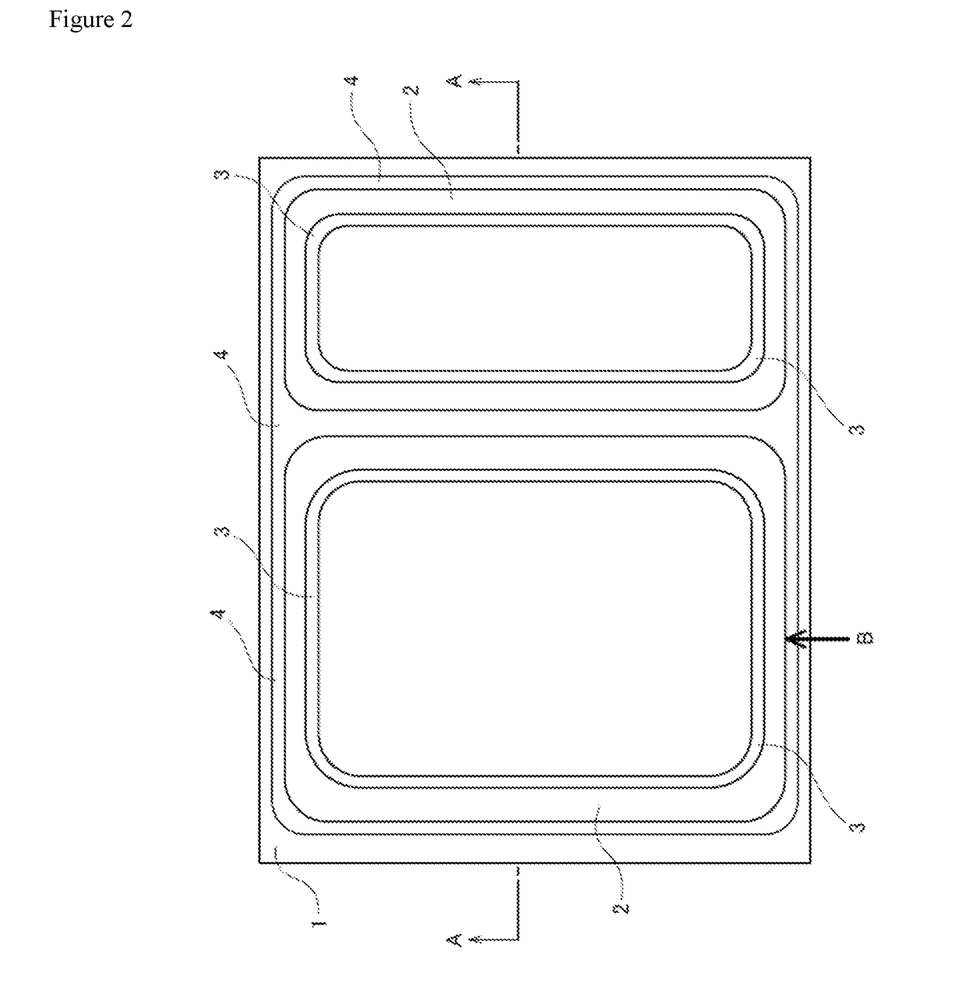
FIG. 2 is an explanatory drawing showing a state in which an insulating resin 3 (for solder resist) and an insulating resin 4 (for preventing partial discharges and the lowering of insulation) are applied to the metal circuit 2 shown in FIG. 1.

Referring to FIGS. 1 and 2, a ceramic circuit substrate for a power module according to the first embodiment of the present invention is a ceramic circuit substrate used in a power module and formed by bonding a metal circuit 2 and a ceramic substrate 1, characterized in that an insulating resin 3 is applied to a main surface of the metal circuit and an insulating resin 4 is applied to the outer peripheral part of the metal circuit 2 and/or between metal circuits.

Figure 3:
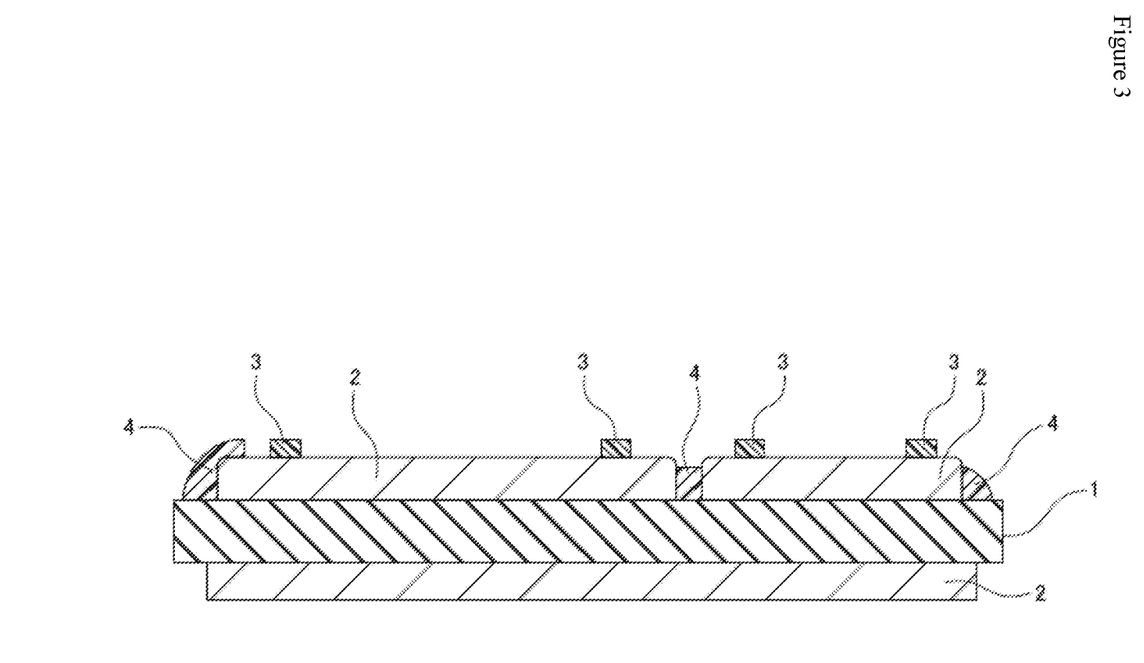
FIG. 3 is a cross-sectional view along the direction A-A in FIG. 2.

Referring to FIGS. 2 and 3, the outer peripheral part of the metal circuit 2 and/or between metal circuits to which the insulating resin 4 is applied comprises the main surface of the ceramic substrate 1 and an outer peripheral end part of the main surface of the metal circuit 2, which are bonded by a brazing material portion or brazing material for bonding the metal circuit 2 and the ceramic substrate 1.

(Metal Circuit)

From the viewpoints of electrical conductivity and thermal conductivity, copper, aluminum, silver, gold, etc. can be used as the material for the metal circuit, but from viewpoints such as cost and subsequent circuit formation, copper or aluminum is used. The metal circuit in the present embodiment can use a metal constituted by copper or aluminum, or a two-layer clad material of copper and aluminum.

The plate thickness of the metal circuit in the present embodiment is not particularly limited, but is preferably 0.10-1.5 mm. In cases in which the plate thickness is set to 0.10 mm or greater and used as a circuit substrate for a power module, sufficient conductivity can be ensured and problems such as heat generation in the metal circuit portion are suppressed, and by setting the plate thickness to 1.5 mm or less, lowering of the heat dissipation characteristics of the circuit substrate due to the thermal resistance of the metal circuit itself increasing is suppressed.

(Ceramic Substrate)

In the present embodiment, the ceramic substrate is not particularly limited and nitride-based ceramics such as silicon nitride and aluminum nitride, oxide-based ceramics such as aluminum oxide and zirconium oxide, carbide-based ceramics such as silicon carbide, boride-based ceramics such as lanthanum boride, and the like can be used. When used in a power module, non-oxide-based ceramics such as aluminum nitride and silicon nitride, and oxide-type ceramics such as aluminum oxide are preferred.

The thickness of the ceramic substrate is not particularly limited, but durability is obtained by setting the thickness to 0.2 mm or greater and thermal resistance increasing can be suppressed by setting the thickness to 1.5 mm or less, so a thickness of 0.2-1.5 mm is preferred.

(Insulating Resin)

The insulating resin in the present embodiment is not particularly limited so long as it is a resin having insulation, but the resin may be a resin having at least one resin selected from of an epoxy resin, a polyimide resin, an acrylic resin, and a silicone resin as the main component.

Referring to FIGS. 2 and 3, in the present embodiment, an insulating resin 3 having the objective of preventing solder flow or chip displacement (first insulating resin 3) and an insulating resin 4 having the objective of preventing partial discharges or the lowering of insulation (second insulating resin 4) are each applied to the main surface of the metal circuit 2 and the outer peripheral part of the metal circuit 2 and/or between metal circuits.

Further, the first insulating resin 3 and the second insulating resin 4 may have the same resin as the main component or may have different resins as the main component.

The thickness of the insulating resin applied to the ceramic circuit substrate 1 is not particularly limited, but printing at a thickness of 5-500 μm is preferred.

[Bonding Method]

As for the method for bonding the metal circuit and the metal plate on the ceramic substrate, there are active metal methods employing a brazing material and direct bonding methods in which the metal circuit substrate or the metal plate is disposed directly on the ceramic substrate and heated in an inert atmosphere. For example, in cases of bonding a copper plate and a ceramic substrate, disposing an oxygen-free copper plate wherein a surface thereof has been oxidation-treated or a tough pitch copper plate on an oxide-based ceramic substrate such as alumina and heating in an inert gas and directly bonding the copper plate and the ceramic substrate is known. In the present embodiment, the same effects are obtained in either case.

Further, as the method for forming the predetermined circuit pattern of the metal circuit substrate, there are methods for bonding a metal plate and then carrying out patterning by forming a circuit-shaped resist on a surface of the metal plate and etching and methods for forming a metal plate in the circuit shape ahead of time by pressing or etching and then bonding the pattern shape to the ceramic substrate. After forming the pattern, Ni plating, Ni alloy plating, gold plating, silver plating, and rustproofing may be performed on the metal plate, as necessary.

[Method for Manufacturing a Ceramic Circuit Substrate for a Power Module]

A method for manufacturing a ceramic circuit substrate for a power module of one embodiment of the present invention is characterized by, in a ceramic circuit substrate formed by bonding a metal circuit and a ceramic substrate, simultaneously applying an insulating resin to a main surface of the metal circuit and an outer peripheral part of the metal circuit or between metal circuits. Here, simultaneously applying means applying to the main surface of the metal circuit and applying to the outer peripheral part of the metal circuit or between metal circuits continuously or simultaneously during a series of processes.

Further, the application method for the insulating resin may be printing using an inkjet printing method or a pad printing method. In particular, inkjet printing is a non-contact (other than the ink) direct patterning method and, by inputting print data, can have good positional accuracy and print efficiently, even on a printing surface with different heights. Further, inkjet printing can also suitably print to the outer peripheral part of the metal circuit or between metal circuits, which have narrow print widths, or to the stepped portion between the ceramic substrate and the metal circuit main surface. Pad printing can also suitably print to the outer peripheral part of the metal circuit or between metal circuits, which have narrow print widths, or to the stepped portion between the ceramic substrate and the metal circuit main surface.

[Printing Accuracy]

In the method for manufacturing a ceramic circuit substrate of the present embodiment, the insulating resin is applied to the ceramic circuit substrate with a print accuracy wherein the amount of deviation is 0.4 mm or less, preferably 0.25 mm or less, and more preferably 0.2 mm or less.

[Partial Discharge Properties]

The partial discharge electric load of the ceramic circuit substrate of the present embodiment is 1.0 pC or less, preferably 0.7 pC or less, and more preferably 0.5 pC or less.

EXAMPLES

Examples and comparative examples of the present invention shall be specifically explained below, but the present invention is not at all limited by the details of the examples, etc.

Example 1

Metal circuits were disposed on one main surface of a 55 mm×48 mm×1.0 mmt aluminum nitride substrate with a 0.3 mmt copper plate in the pattern shown in FIG. 1 such that the inter-pattern distance between 30 mm×44 mm and 20.5 mm×44 mm circuits becomes 0.50 mm. A ceramic circuit substrate was fabricated by bonding a 52 mm×45 mm×0.3 mmt copper plate (heat dissipating plate) on the other main surface. The ceramic circuit substrate shown in FIG. 2 was obtained by simultaneously applying to the ceramic metal circuit substrate with an inkjet printing method (device name: inkjet printer manufactured by Nippon Bunkaseiko Co., Ltd. (head: GEN5 manufactured by Ricoh, Co., Ltd.)) a resin having an epoxy resin as the main component (IJSR-4000 manufactured by TAIYO INK MFG. CO., LTD.) in the pattern shown in FIG. 2, to the metal circuit main surfaces at a width of 3.00 mm at a position 3.00 mm inwards from the circuit outer peripheral parts, to the outer peripheral parts of the circuit parts at a width of 1.00 mm, and between the metal circuits at a width of 0.50 mm.

Example 2

The ceramic circuit substrate shown in FIG. 2 was obtained similarly to Example 1, other than a two-layer clad material in which a 0.2 mmt copper plate and a 0.2 mmt aluminum plate are diffusion bonded (the aluminum plate side is bonded to the aluminum nitride substrate) being used in place of the copper plate.

Example 3

The ceramic circuit substrate shown in FIG. 2 was obtained similarly to Example 1, other than a resin having a polyimide resin as the main component (LIXON COAT manufactured by JNC Corporation) being used in place of the resin having an epoxy resin as the main component.

Example 4

The ceramic circuit substrate shown in FIG. 2 was obtained similarly to Example 1, other than a resin having an acrylic resin as the main component (PER400 manufactured by GOO CHEMICAL CO., LTD.) being used in place of the resin having an epoxy resin as the main component.

Example 5

The ceramic circuit substrate shown in FIG. 2 was obtained similarly to Example 1, other than a 0.4 mmt aluminum plate being used in place of the 0.3 mmt copper plate.

Example 6

The ceramic circuit substrate shown in FIG. 2 was obtained similarly to Example 5, other than a resin having a polyimide resin as the main component (LIXON COAT manufactured by JNC Corporation) being used in place of the resin having an epoxy resin as the main component.

Example 7

The ceramic circuit substrate shown in FIG. 2 was obtained similarly to Example 5, other than a resin having an acrylic resin as the main component (PER400 manufactured by GOO CHEMICAL CO., LTD.) being used in place of the resin having an epoxy resin as the main component.

Example 8

The ceramic circuit substrate shown in FIG. 2 was obtained similarly to Example 5, other than a resin having a silicone resin as the main component (WL-5351 manufactured by Dow Corning Toray, Co. Ltd.) being used in place of the resin having an epoxy resin as the main component.

Example 9

The ceramic circuit substrate shown in FIG. 2 was obtained similarly to Example 1, other than a 0.635 mm thickness silicon nitride substrate being used in place of the aluminum nitride substrate.

Example 10

The ceramic circuit substrate shown in FIG. 2 was obtained similarly to Example 9, other than a polyimide resin (LIXON COAT manufactured by JNC Corporation) being used in place of the resin having an epoxy resin as the main component.

Example 11

The ceramic circuit substrate shown in FIG. 2 was obtained similarly to Example 9, other than a resin having an acrylic resin as the main component (PER400 manufactured by GOO CHEMICAL CO., LTD.) being used in place of the resin having an epoxy resin as the main component.

Example 12

The ceramic circuit substrate shown in FIG. 2 was obtained similarly to Example 9, other than a 0.4 mmt aluminum plate being used in place of the 0.3 mmt copper plate.

Example 13

The ceramic circuit substrate shown in FIG. 2 was obtained similarly to Example 12, other than a resin having a polyimide resin as the main component (LIXON COAT manufactured by JNC Corporation) being used in place of the resin having an epoxy resin as the main component.

Example 14

The ceramic circuit substrate shown in FIG. 2 was obtained similarly to Example 1, other than a 0.635 mmt alumina substrate being used in place of the aluminum nitride substrate.

Example 15

The ceramic circuit substrate shown in FIG. 2 was obtained similarly to Example 1, other than a resin having an epoxy resin as the main component (UVR-150G manufactured by TAIYO INK MFG. CO., LTD.) being simultaneously applied to the circuit surfaces, the circuit outer peripheral parts, and between the metal circuits by a pad printing method in place of an inkjet printing method.

Example 16

The ceramic circuit substrate shown in FIG. 2 was obtained similarly to Example 15, other than a resin having a silicone resin as the main component (WL-5351 manufactured by Dow Corning Toray, Co. Ltd.) being used in place of the resin having an epoxy resin as the main component.

Comparative Example 1

A ceramic circuit substrate fabricated similarly to Example 1 was used in a state in which an insulating resin was not applied.

Comparative Example 2

A ceramic circuit substrate fabricated similarly to Example 5 was used in a state in which an insulating resin was not applied.

Comparative Example 3

A ceramic circuit substrate fabricated similarly to Example 9 was used in a state in which an insulating resin was not applied.

Comparative Example 4

A ceramic circuit substrate fabricated similarly to Example 14 was used in a state in which an insulating resin was not applied.

Comparative Example 5

The ceramic circuit substrate shown in FIG. 2 was obtained by, similar to conventional processes, after performing a step for applying an insulating resin to a main surface of the metal circuit on the ceramic circuit substrate on which metal circuits and a heat dissipating plate are disposed described in Example 1, temporarily removing and resetting, and then separating the steps for applying an insulating resin to the outer peripheral parts of the circuit parts and between the metal circuits and individually applying a resin having an epoxy resin as the main component (ISJR-4000 manufactured by TAIYO INK MFG. CO., LTD.) with an inkjet printing method.

Comparative Example 6

The ceramic circuit substrate shown in FIG. 2 was obtained similarly to Comparative Example 5, other than a resin having a polyimide resin as the main component (LIXON COAT manufactured by JNC Corporation) being used in place of the resin having an epoxy resin as the main component.

Comparative Example 7

The ceramic circuit substrate shown in FIG. 2 was obtained similarly to Comparative Example 5, other than a resin having an acrylic resin as the main component (PER400 manufactured by GOO CHEMICAL CO., LTD.) being used in place of the resin having an epoxy resin as the main component.

Comparative Example 8

The ceramic circuit substrate shown in FIG. 2 was obtained similarly to Comparative Example 5, other than a resin having a silicone resin as the main component (WL-5351 manufactured by Dow Corning Toray, Co. Ltd.) being used in place of the resin having an epoxy resin as the main component.

The partial discharge properties and insulating properties of the ceramic circuit substrates fabricated in Examples 1-16 and Comparative Examples 1-8 were evaluated with the following method. The results are shown in Table 1.

<Printing Accuracy>

In the 30 obtained ceramic circuit substrates, the amount of deviation from the predetermined distance of 3.00 mm between the insulating resin (solder resist) (3) and the insulating resin (insulation degradation/discharge preventing) (4) was measured with an optical microscope (30× magnification) at B shown in FIG. 2 and was set as the printing precision (amount of deviation).

<Evaluation of Partial Discharge Properties>

The obtained ceramic circuit substrates were raised to 10 kV at a voltage elevation rate of 0.3 kV/s in an insulating oil, the voltage was then dropped to 8 kV at a rate of 0.5 kV/s, and 8 kV was maintained for 10 seconds and the partial discharge electric load at this time was measured with a partial discharge measurement device (TTP15) manufactured by Mess & Prufsysteme GmbH.

<Evaluation of Insulating Properties>

The insulation resistance of the 30 ceramic circuit substrates was measured while charging the substrates with a voltage of 1.0 kV for 500 hours at 85 C and 93% Rh and the number of substrates in which the insulation resistance value was $1\times10^6 \Omega$ or less was set as the number of substrates with degraded insulation.

TABLE 1

| | Ceramic Substrate | Metal Plate | Insulating Resin | Printing (Y/N) | | Printing Order | Printing Method | Printing Accuracy (Displacement Amount) | Partial Discharge Electric Load | Insulating Properties |
| | | | | Circuit Surface | Outer Peripheral Part or Between Metal | | | | | |
|---|---|---|---|---|---|---|---|---|---|---|
| Example 1 | Aluminum Nitride | Copper | Epoxy Resin-based | Yes | Yes | Simultaneous Application | Inkjet Printing Method | 0.15 mm | 0.2 pC | 0/30 |

TABLE 1-continued

| | Ceramic Substrate | Metal Plate | Insulating Resin | Printing (Y/N) Circuit Surface | Printing (Y/N) Outer Peripheral Part or Between Metal | Printing Order | Printing Method | Printing Accuracy (Displacement Amount) | Partial Discharge Electric Load | Insulating Properties |
|---|---|---|---|---|---|---|---|---|---|---|
| Example 2 | Aluminum Nitride | Copper and Aluminum | Epoxy Resin-based | Yes | Yes | Simultaneous Application | Inkjet Printing Method | 0.16 mm | 0.2 pC | 0/30 |
| Example 3 | Aluminum Nitride | Copper | Polyimide Resin-based | Yes | Yes | Simultaneous Application | Inkjet Printing Method | 0.18 mm | 0.3 pC | 0/30 |
| Example 4 | Aluminum Nitride | Copper | Acrylic Resin-based | Yes | Yes | Simultaneous Application | Inkjet Printing Method | 0.22 mm | 0.6 pC | 0/30 |
| Example 5 | Aluminum Nitride | Aluminum | Epoxy Resin-based | Yes | Yes | Simultaneous Application | Inkjet Printing Method | 0.18 mm | 0.4 pC | 0/30 |
| Example 6 | Aluminum Nitride | Aluminum | Polyimide Resin-based | Yes | Yes | Simultaneous Application | Inkjet Printing Method | 0.19 mm | 0.4 pC | 0/30 |
| Example 7 | Aluminum Nitride | Aluminum | Acrylic Resin-based | Yes | Yes | Simultaneous Application | Inkjet Printing Method | 0.22 mm | 0.8 pC | 0/30 |
| Example 8 | Aluminum Nitride | Aluminum | Silicone Resin-based | Yes | Yes | Simultaneous Application | Inkjet Printing Method | 0.25 mm | 0.9 pC | 0/30 |
| Example 9 | Silicon Nitride | Copper | Epoxy Resin-based | Yes | Yes | Simultaneous Application | Inkjet Printing Method | 0.16 mm | 0.3 pC | 0/30 |
| Example 10 | Silicon Nitride | Copper | Polyimide Resin-based | Yes | Yes | Simultaneous Application | Inkjet Printing Method | 0.18 mm | 0.3 pC | 0/30 |
| Example 11 | Silicon Nitride | Copper | Acrylic Resin-based | Yes | Yes | Simultaneous Application | Inkjet Printing Method | 0.23 mm | 0.7 pC | 0/30 |
| Example 12 | Silicon Nitride | Aluminum | Epoxy Resin-based | Yes | Yes | Simultaneous Application | Inkjet Printing Method | 0.18 mm | 0.4 pC | 0/30 |
| Example 13 | Silicon Nitride | Aluminum | Polyimide Resin-based | Yes | Yes | Simultaneous Application | Inkjet Printing Method | 0.18 mm | 0.4 pC | 0/30 |
| Example 14 | Alumina | Copper | Epoxy Resin-based | Yes | Yes | Simultaneous Application | Inkjet Printing Method | 0.16 mm | 0.4 pC | 0/30 |
| Example 15 | Aluminum Nitride | Copper | Epoxy Resin-based | Yes | Yes | Simultaneous Application | Pad Printing Method | 0.29 mm | 0.8 pC | 0/30 |
| Example 16 | Aluminum Nitride | Copper | Silicone Resin-based | Yes | Yes | Simultaneous Application | Pad Printing Method | 0.35 mm | 0.9 pC | 0/30 |
| Comparative Example 1 | Aluminum Nitride | Copper | None | No | No | — | — | — | 2.3 pC | 6/30 |
| Comparative Example 2 | Aluminum Nitride | Aluminum | None | No | No | — | — | — | 2.8 pC | 9/30 |
| Comparative Example 3 | Silicon Nitride | Copper | None | No | No | — | — | — | 2.5 pC | 6/30 |
| Comparative Example 4 | Alumina | Copper | None | No | No | — | — | — | 5.0 pC | 12/30 |
| Comparative Example 5 | Aluminum Nitride | Copper | Epoxy Resin-based | Yes | Yes | Individual Application | Inkjet Printing Method | 0.49 mm | 1.4 pC | 3/30 |
| Comparative Example 6 | Aluminum Nitride | Copper | Polyimide Resin-based | Yes | Yes | Individual Application | Inkjet Printing Method | 0.51 mm | 1.2 pC | 3/30 |
| Comparative Example 7 | Aluminum Nitride | Copper | Acrylic Resin-based | Yes | Yes | Individual Application | Inkjet Printing Method | 0.54 mm | 1.3 pC | 4/30 |
| Comparative Example 8 | Aluminum Nitride | Copper | Silicone Resin-based | Yes | Yes | Individual Application | Inkjet Printing Method | 0.55 mm | 1.5 pC | 3/30 |

From the above, the ceramic substrates of the present examples could prevent solder flow and chip displacement because an insulating resin had been applied to the metal circuit main surfaces, and lowering of insulation resistance due to the lowering of partial discharge inception voltage or migration of brazing material components when voltage was applied was prevented due to an insulating resin being applied to the outer peripheral part of the metal circuits or between the circuits. Further, by simultaneously printing the insulating resin, printing accuracy improved and partial discharge properties and insulating properties were improved without lowering productivity.

INDUSTRIAL APPLICABILITY

According to the present invention, a ceramic circuit substrate in which lowering of insulation resistance due to the lowering of partial discharge inception voltage or migration of brazing material components when voltage is applied is prevented can be obtained by applying an insulating resin for preventing solder flow and chip displacement to a circuit substrate in which a metal circuit and a ceramic substrate are bonded and applying an insulating resin for preventing partial discharges and lowering of insulation to the outer peripheral part of the metal circuit or between metal circuits.

REFERENCE SIGNS LIST

1 Ceramic substrate
2 Metal circuit
3 Insulating resin (solder resist)
4 Insulating resin (insulation degradation/discharge preventing)

The invention claimed is:

1. A ceramic circuit substrate for a power module comprising a metal circuit, a ceramic substrate, a weir part comprising a first insulating resin and an insulating part comprising a second insulating resin,
wherein the metal circuit and the ceramic substrate are bonded;
the weir part is formed on a main surface of the metal circuit and is formed in a band shape along an edge of the metal circuit;
the insulating part is provided to at least one selected from the group consisting of an outer peripheral part of the metal circuit and between the metal circuits; and
the weir part and the insulating part are provided independently so as not to contact each other.

2. The ceramic circuit substrate for a power module according to claim 1, wherein: the ceramic substrate is an aluminum nitride, silicon nitride, or alumina substrate; the metal circuit is constituted by at least one metal selected from copper and aluminum; and a resin containing at least one resin selected from an epoxy resin, a polyimide resin, an acrylic resin, and a silicone resin is used as the first insulating resin or the second insulating resin.

3. The ceramic circuit substrate for a power module according to claim 1, wherein the insulating part is applied to the outer peripheral part of the metal circuit and between the metal circuits.

4. The ceramic substrate for a power module according to claim 1, wherein the insulating part is formed in a band shape along the outer peripheral part of the metal circuit.

5. A method for manufacturing the ceramic circuit substrate for a power module according to claim 1, wherein the insulating resin is applied simultaneously to the main surface of the metal circuit and to the outer peripheral part of the metal circuit and/or between the metal circuits.

6. The method for manufacturing a ceramic circuit substrate for a power module according to claim 5, wherein the method for applying the insulating resin is an inkjet printing method or a pad printing method.

7. A method for manufacturing the ceramic circuit substrate for a power module according to claim 2, wherein the insulating resin is applied simultaneously to the main surface of the metal circuit and to the outer peripheral part of the metal circuit and/or between the metal circuits.

8. The method for manufacturing a ceramic circuit substrate for a power module according to claim 7, wherein the method for applying the insulating resin is an inkjet printing method or a pad printing method.

* * * * *